(12) United States Patent
Mahatme et al.

(10) Patent No.: US 11,222,679 B2
(45) Date of Patent: Jan. 11, 2022

(54) PACKAGED INTEGRATED CIRCUIT HAVING A PHOTODIODE AND A RESISTIVE MEMORY

(71) Applicant: NXP USA, Inc., Austin, TX (US)

(72) Inventors: Nihaar N. Mahatme, Austin, TX (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/573,075

(22) Filed: Sep. 17, 2019

(65) Prior Publication Data

US 2021/0082488 A1 Mar. 18, 2021

(51) Int. Cl.
| | |
|---|---|
| *G11C 11/16* | (2006.01) |
| *H01L 31/0203* | (2014.01) |
| *H01L 43/02* | (2006.01) |
| *H01L 43/08* | (2006.01) |
| *G11C 5/14* | (2006.01) |
| *H01L 27/22* | (2006.01) |

(52) U.S. Cl.
CPC .......... *G11C 11/1697* (2013.01); *G11C 5/142* (2013.01); *G11C 5/147* (2013.01); *G11C 11/1673* (2013.01); *G11C 11/1675* (2013.01); *G11C 11/1695* (2013.01); *H01L 27/222* (2013.01); *H01L 31/0203* (2013.01); *H01L 43/02* (2013.01); *H01L 43/08* (2013.01)

(58) Field of Classification Search
CPC ............ G11C 11/1697; G11C 11/1673; G11C 11/1695; G11C 5/147; H01L 31/0203
USPC .......................................................... 365/158
See application file for complete search history.

(56) References Cited

U.S. PATENT DOCUMENTS

| | | | |
|---|---|---|---|
| 8,089,285 B2 | 1/2012 | Hsu et al. | |
| 2013/0211608 A1* | 8/2013 | Farrell | H05B 47/175 700/286 |
| 2016/0238439 A1* | 8/2016 | Chu | H01L 31/02327 |
| 2017/0061752 A1* | 3/2017 | Chen | G05F 3/02 |
| 2017/0221779 A1* | 8/2017 | Linder | H01L 22/20 |
| 2018/0006182 A1* | 1/2018 | Renard | H01S 5/183 |
| 2021/0067440 A1* | 3/2021 | Rodinger | H04L 41/12 |

OTHER PUBLICATIONS

Guilar et al.: "Integrated Solar Energy Harvesting and Storage", IEEE Transactions on Very Large Scale Integration (VLSI) Systems, vol. 17, No. 5, May 2009, pp. 627-637.

* cited by examiner

*Primary Examiner* — Sung Il Cho (57) ABSTRACT

A packaged integrated circuit includes a photodiode and a memory. The photodiode generates energy when radiation strikes a surface of the photodiode. The memory includes a plurality of non-volatile memory cells and memory control circuitry. The memory control circuitry is configured to perform an operation to change values stored in at least some of the memory cells of the plurality of non-volatile memory cells while being powered by energy generated by the photodiode. An encapsulant at least partially encapsulates the photodiode and the memory, in which the encapsulant blocks radiation from reaching the surface of the photodiode.

20 Claims, 4 Drawing Sheets

PACKAGED INTEGRATED CIRCUIT HAVING A PHOTODIODE AND A RESISTIVE MEMORY

BACKGROUND

Field

This disclosure relates generally to packaged integrated circuits, and more specifically, to a packaged integrated circuit having a photodiode and resistive memory.

Related Art

In integrated circuits (ICs) today, resistive memories, such as magnetoresistive random access memories (MRAMs), are increasingly used as non-volatile memories, replacing, for example, embedded flash. These integrated circuits are packaged such that they are surrounded by an encapsulant and can be used in a variety of applications. A malicious entity may attempt to discover the contents of the resistive memory by decapsulating or de-lidding a packaged IC containing a resistive memory. In the case of such an attack, critical information stored in the resistive memory of the IC could be discoverable. These types of attacks may also be used to disable security fuses or one-time programmable (OTP) memories as well. Therefore, a need exists to protect critical data stored in non-volatile memories from such attacks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to ensure that critical information is not recovered upon decapsulating or de-lidding a packaged IC or System on Chip (SoC), a photodiode is used to detect the breaking through the package, and upon the exposure of the photodiode to light, using the energy provided by the photodiode from the light exposure, modifying critical data locations. In this manner, critical data can be destroyed upon light striking the surface of the photodiode, even if no other power is being provided to or stored on the chip. In addition to destroying critical data, the tamper event can also be logged using the energy provided from the light exposure.

Figure 1:
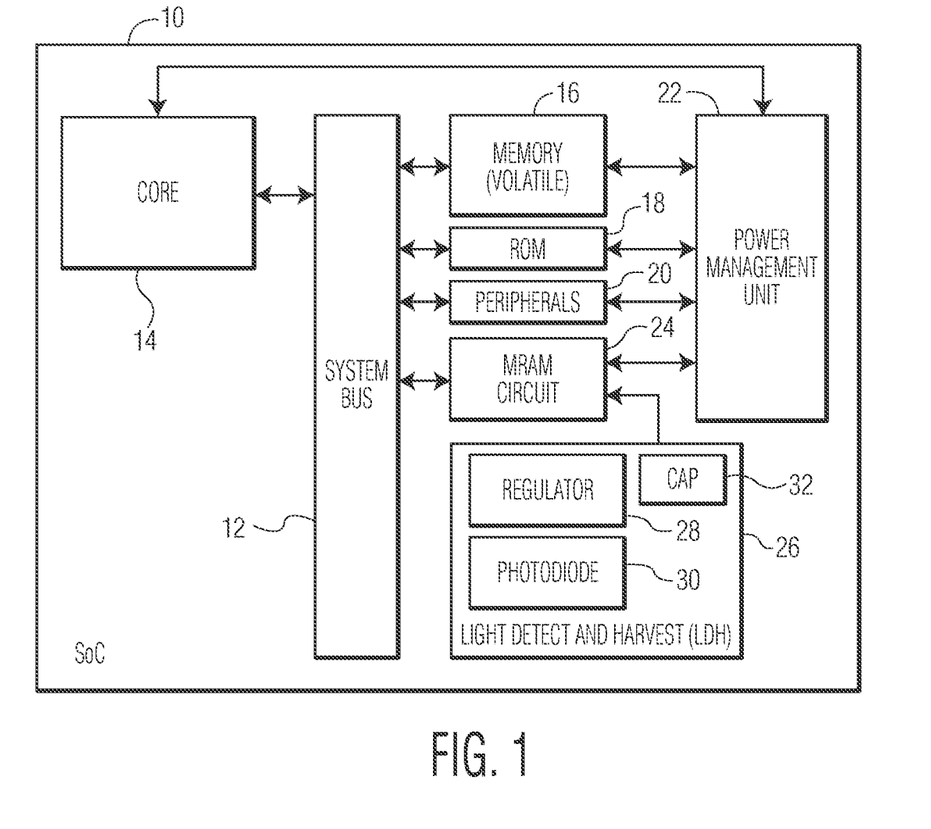
FIG. 1 illustrates, in partial schematic and partial block diagram form, an IC in accordance with one embodiment of the present invention.

FIG. 1 illustrates an IC 10 in accordance with one embodiment of the present invention. IC 10 may also be referred to as an SoC, and includes a processor 14, system bus 12, a volatile memory 16, a read-only memory (ROM) 18, peripherals 20, a power management unit (PMU) 22, an MRAM circuit 24, and a light detect and harvest (LDH) circuit 26. Peripherals 20 may include 0 or more peripherals for IC 10. In alternate embodiments, IC 10 may include more, fewer, or different elements than those illustrated in FIG. 1. For example, processor 14 can be any type of processor, such as, for example, a central processing unit (CPU), core, or other bus master of IC 10. System bus 12 can be implemented as any type of system interconnect. Any number (0 or more) of volatile memories, ROMs, and peripherals may be present in the system. MRAM circuit 24 may be a different type of resistive memory or other non-volatile memory.

Each of processor 14, volatile memory 16, ROM 18, peripherals 20 and MRAM 20 is bidirectionally coupled to system bus 12 and bidirectionally coupled to PMU 22. Each of processor 14, volatile memory 16, ROM 18, peripherals 20, and PMU 22 operate as known in the art. LDH circuit 26 includes a voltage regulator (regulator) 28, a photodiode (PD) 30, and a capacitor (cap) 32. MRAM circuit 20 and LDH circuit 26 will be described in reference to FIGS. 2-6 below.

Figure 6:
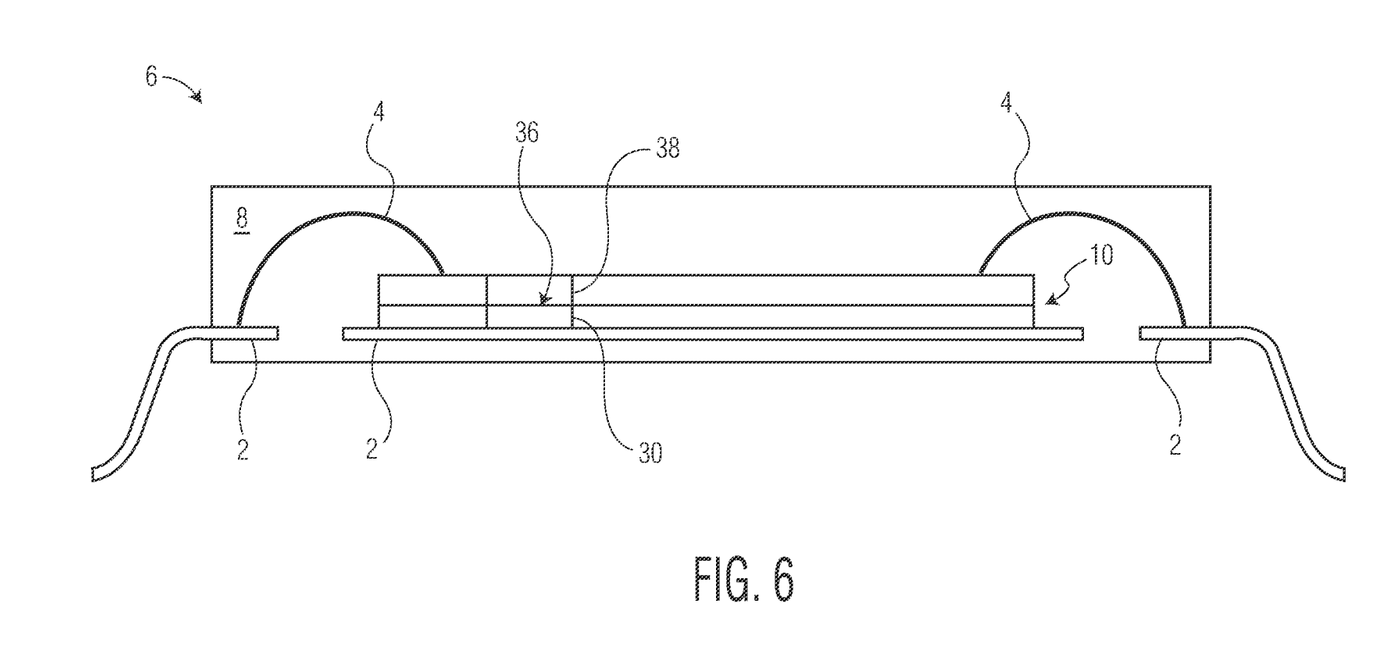
FIG. 6 illustrates a cross-sectional view of a packaged IC with the IC and photodiode of FIG. 1.

FIG. 6 illustrates a cross-sectional view of a packaged IC 6 having IC 10 and photodiode 30. IC 10 is attached to a flag portion of a lead frame 2, in which IC 10 includes photodiode 30 and a radiation-passing material 38 formed on a surface 36 of photodiode 30. When light passes though material 38 and strikes surface 36, photodiode 30 conducts. Electrical connections, such as wire bonds 4, electrically connect IC 10 with leads of lead frame 2. An encapsulant 8 surrounds IC 10 and wirebonds 4, and, while intact, prevents radiation or light from reaching photodiode 30. However, if encapsulant 8 is damaged or broken, photodiode 30 is exposed to light and therefore conducts. Note that while a lead frame package is illustrated in FIG. 6, any type of packaging may be used to package IC 10 in which an encapsulant material of the package protects photodiode 30 from any exposure to light while the package remains intact or undamaged. For example, IC 10 can be packaged using flip chip technology or other packaging technologies. Also, IC 10 is illustrated as having two layers, but may have any number of layers, including device layers and routing layers, as needed. FIG. 6 is simply intended as a simplified cross section of a packaged IC.

Figure 2:
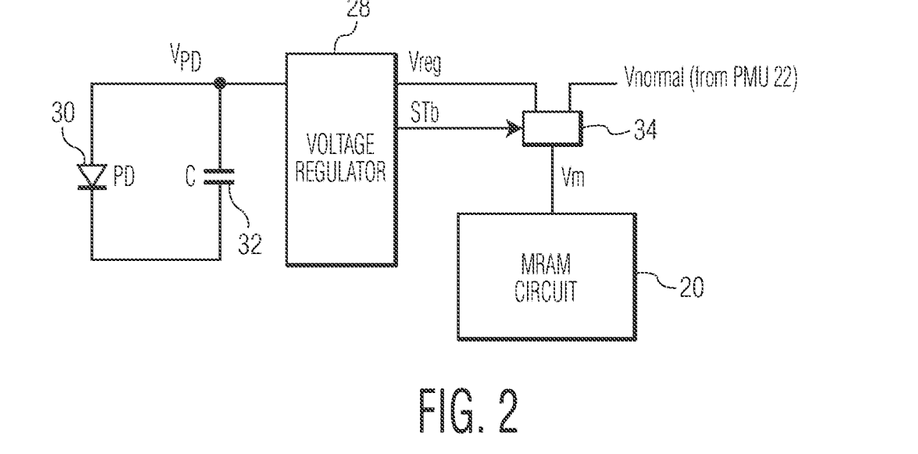
FIG. 2 illustrates, in partial schematic and partial block diagram form, further details of the Light Detect and Harvest (LDH) circuit and MRAM circuit of FIG. 1, in accordance with one embodiment of the present invention.

FIG. 2 illustrates LDH circuit 26 and MRAM circuit 20 of IC 10 in further detail, in accordance with one embodiment of the present invention. An anode of PD 30 is coupled to a first terminal of capacitor 32 and provides a voltage, $V_{PD}$, to an input of voltage regulator 28. A cathode of PD 30 is coupled to a second terminal of capacitor 32. Voltage regulator 28 provides a regulated voltage, Vreg, and a control signal switch threshold indicator, STb. PMU 22, during normal operation of IC 10, provides Vnormal, in which Vnormal corresponds to a normal operating voltage of IC 10 which is provided to MRAM circuit 20 for normal operation. As used herein, normal operation refers to operation when no tamper has been detected and thus PD 30 has not been exposed to light. Therefore, normal operation may include full power and low power states, as controlled by PMU 22, in which Vnormal is provided according to the power state.

A switch 34, which may also be referred to as a power switch and which may be considered as part of LDH circuit 26 or MRAM circuit 20, has a first voltage input coupled to receive Vreg, a second input coupled to receive Vnormal, and an output which provides a memory voltage Vm to MRAM circuit 20. Vnormal is provided as Vm unless STb is asserted. When STb is asserted, switch 34 provides Vreg as Vm. In the illustrated embodiments of both FIGS. 2 and 3, STb is an active low signal (indicated by the "b" such that when it is asserted, it is at zero). STb is asserted when voltage regulator 28 detects that VPD has reached a predetermined threshold voltage. Prior to VPD reaching this predetermined threshold voltage, STb may be floating.

While the packaging of IC 10 (e.g. encapsulant 8) remains intact, PD 30 is not exposed to light, such that no energy is produced by PD 30 and no energy is stored in capacitor 32. Therefore, $V_{PD}$ remains at zero volts. Since VPD is at 0, STb is also not yet asserted, thus Vnormal is provided as Vm to MRAM circuit 30. However, when PD 30 is exposed to light, due, for example, to decapsulating or de-lidding IC 10 which removes the opaque packaging or encapsulant preventing light from reaching PD 30, electron-hole pairs are generated in the reverse-biased junction of PD 30 causing current to flow. This current charges capacitor 32, and $V_{PD}$ begins to rise. Voltage regulator 28 regulates $V_{PD}$ to provide the regulated voltage supply, Vreg. When $V_{PD}$ reaches the predetermined threshold voltage, STb is asserted and Vreg is provided as Vm. At this point, Vreg and not Vnormal is powering MRAM circuit 20.

Figure 3:
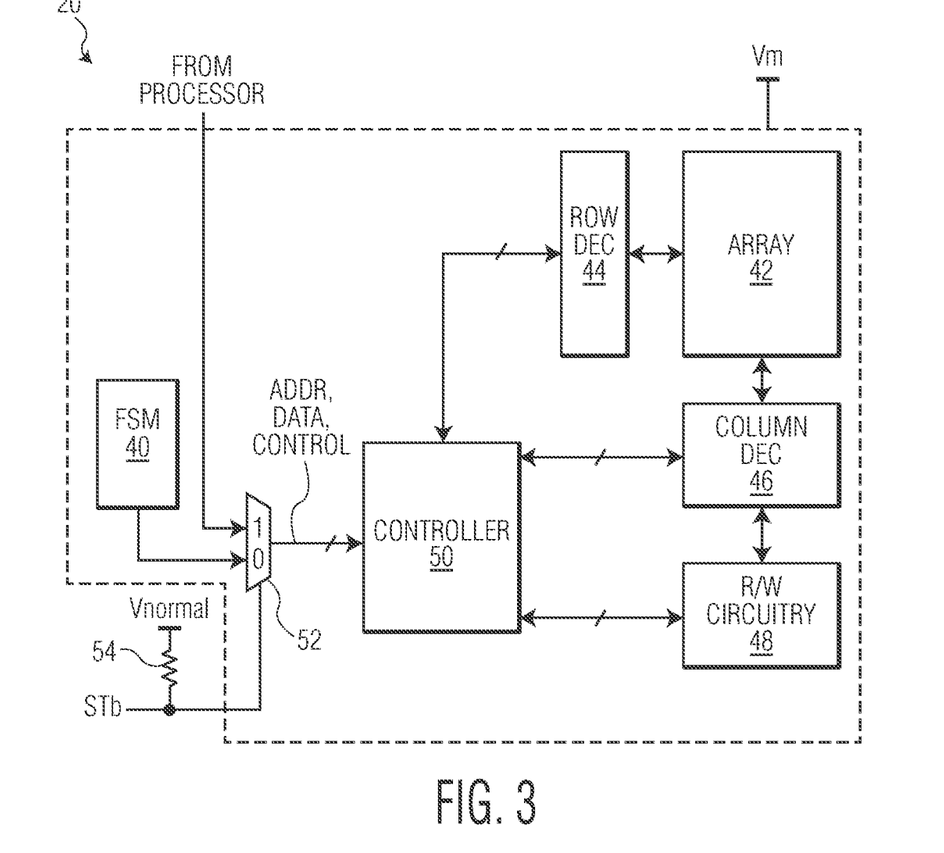
FIG. 3 illustrates, in partial schematic and partial block diagram form, further details of the MRAM circuit of FIGS. 1 and 2, in accordance with one embodiment of the present invention.

FIG. 3 illustrates, in partial schematic and partial block diagram form, MRAM circuit 20 and pull-up resistor 54, in accordance with one embodiment of the present invention. MRAM circuit 20 includes an MRAM array 42 which includes a plurality of MRAM bit cells, a row decoder 44, column decoder 46, read/write (R/W) circuitry 48, a controller 50, a multiplexor (MUX) 52, and a finite state machine (FSM) 40. Controller 50 is coupled to row decoder 44, column decoder 46, and R/W circuitry 48, and receives an address (addr), write data (data), and control (cntrl) signals for write accesses from an output of MUX 52. Row decoder 44, column decoder 46, and R/W circuitry 48, with respect to reading from and writing to array 42, operate as known in the art. For example, for a write access, write data received with the write address is written into memory array 42 at the write address. A portion of the address is provided to row decoder to activate selected word lines, and another portion of the address is provided to column decoder 46 to properly set the selected bit lines and source lines. Write circuitry 48 sets the selected bit lines and source lines according to the write data, such that data is correctly stored in the bit cells located at the intersection of the selected word lines and selected bit lines. For read accesses, a read address and control signals are provided to controller 50 such that read circuitry in R/W circuitry 48 can properly sense the bit cells at the read address and provide read data in response to the write access.

For memory accesses, controller 50 receives addr, data, and cntrl from the output of MUX 52. This addr, data, and cntrl can come from processor 14 or from FSM 40. A first input of MUX 52 is coupled to receive addr, data, and cntrl from processor 14 and a second input of MUX 52 is coupled to receive addr, data, and cntrl from FSM 40. A control input of MUX 52 is coupled to receive STb, in which STb is coupled via pull-up resistor 54 to Vnormal. During normal operation, pull-up resistor 54 maintains the control input of MUX 52 to select the first input. In this manner, during normal operation, without STb being asserted, MUX 52 selects the addr, data, and cntrl from processor 14 to provide to controller 50. However, when STb is asserted to 0 by voltage regulator 28, MUX 52 selects the addr, data, and cntrl from FSM 40 to provide to controller 50.

When STb is asserted, indicating that PD 30 has been exposed to light and $V_{PD}$ has reached the predetermined threshold, MRAM circuit 20 is powered by Vreg (which is provided instead of Vnormal as Vm). Note that STb is asserted during the duration of a tamper event, in which energy is harvested from the exposure to light by PD 30 to power any circuit whose power is supplied by Vm. Therefore, during the tamper event, FSM 40, controller 50, row decoder 44, column decoder 46, R/W circuitry 48, and array 42 are powered by Vreg.

In one embodiment, STb is asserted as soon as PD 30 is exposed to light. In an alternate embodiment, the predetermined threshold voltage is set to a value which allows $V_{PD}$ to reach a minimum voltage first before powering MRAM circuit 20. Once STb is asserted, though, FSM 40 controls writes performed in array 42. In one embodiment, FSM 40 goes through a series of states which writes to a set of predetermined memory locations of array 42. These predetermined memory locations may be those memory locations which store critical data, such as, for example, security keys and passwords. FSM 40 may cause the data in the predetermined memory locations to be cleared, by writing all 0s into the memory location or may adjust the data in a different way to obscure the secure data. In one embodiment, one of the predetermined memory locations is written with a predetermined tamper value, such as all 1s, to store a tamper indication in array 42. This tamper value stored in one of the predetermined memory locations can be used when performing failure analysis on the chip to determine that a tamper of the package has in fact occurred. FSM 40 is designed such that it cycles between a few known states to access MRAM addresses to clear or otherwise modify the information. It may also include a state which writes a tamper value to an MRAM location. In one embodiment, FSM 40 is set to cycle in this manner in a continuous loop, in which the cycling of FSM 40, along with the write operations, is powered by energy harvested with PD 30. Note that FSM 40 can be implemented through standard logic gates and storage elements such as flip-flops within the MRAM circuit 20 which is powered by Vreg when STb is asserted. Also, other control circuitry can be used in place of FSM 40 to perform or cycle through the predetermined write operations while powered by Vreg.

In one embodiment, once a tamper is logged by storing the tamper value, processor 14 can be made aware of the tamper event and may enter a secure operating state. For example, processor 14 can operate IC 10 with limited functionality or with restricted access to certain input/output (I/O) peripherals to limit or prevent reads and writes. Processor 14 can halt boot flow, deactivate, or perform a safe shut down. In one embodiment, during a tamper event, FSM 40 modifies those memory locations necessary for proper boot up such that IC 10 can no long enter normal operation once a tamper event has occurred.

Figure 4:
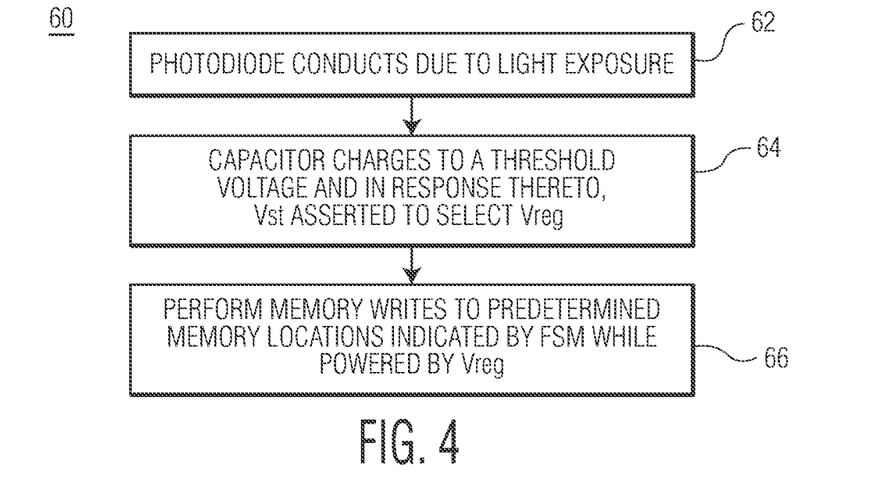
FIGS. 4 and 5 illustrate, in flow diagram form, example operations of the IC of FIG. 1, in accordance with embodiments of the present invention.

FIG. 4 illustrates a method 60 of operating LDH circuit 26 and MRAM circuit 20 upon occurrence of a tamper, in accordance with one embodiment of the present invention. Prior to block 62, IC 10 can be operating in normal operating mode or may be in a shut down or off state. In block 62, photodiode 30 conducts due to light exposure. This may be due, for example, by a tamper even in which tampering with the packaging of IC 10 occurs. In block 64, once photodiode 30 begins conducting, capacitor 32 (thus $V_{PD}$) charges to a predetermined threshold voltage, and in response to reaching the predetermined threshold voltage, STb is asserted to select Vreg (rather than Vnormal) as Vm. Once STb is asserted, in block 66, memory writes are performed to predetermined memory locations indicated by FSM 40 while MRAM circuit 20 is now powered by Vreg. As discussed in reference to FIG. 3, FSM 40 provides the write address and write data to controller 50 via MUX 52.

Figure 5:
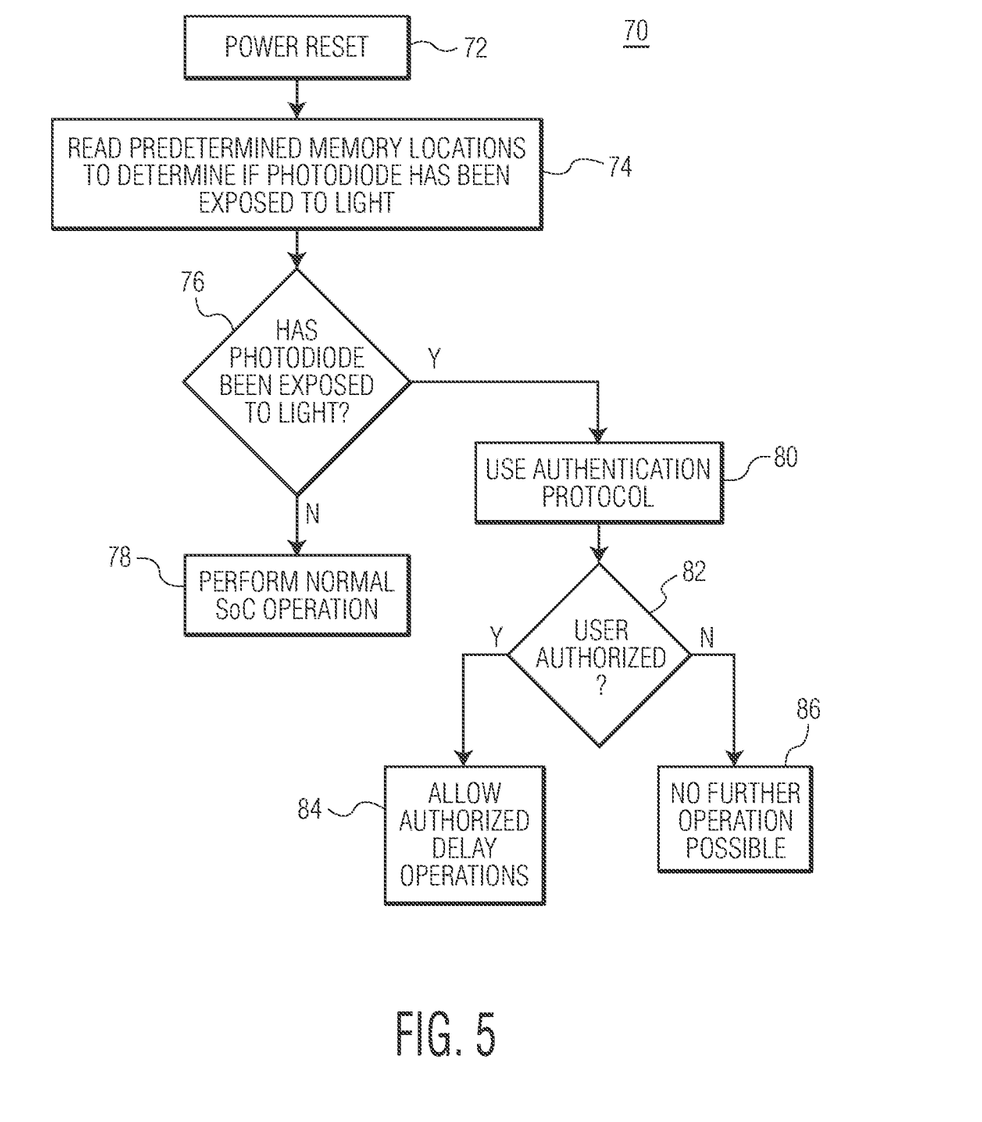

FIG. 5 illustrates a method 70 of operating LDH circuit 26 and MRAM circuit 20 upon reset, in accordance with one embodiment of the present invention. In block 72, IC 10 performs a power reset. Next, in block 74, the predetermined memory location which is intended to log a tamper event is read to determine if PD 30 has been exposed to light. If this predetermined memory location indicates that no tamper event has been logged (for example, is not all 1's), then PD 30 has not been exposed to light and, at decision diamond 76, method 70 proceeds to block 78 in which normal operation of the SoC (e.g. IC 10) is performed. That is, if PD 30 has not been exposed to light, no tamper event has occurred, and normal operation can continue.

However, if the predetermined memory location indicates that a tamper event was logged (for example, is set to all 1's), then PD 30 has been exposed to light and, at decision diamond 76, method 70 proceeds to block 80. An authentication protocol can be performed to determined if an authorized user, such as, for example, the manufacturer or seller of the part, is analyzing IC 10 after the tamper event or if an unauthorized user, such as, for example, a hacker. If the user is authenticated, then method 70 proceeds to block 84 in which authorized debug operations are allowed. If the user is not authenticated, then method 70 proceeds to block 86 in which no further operation is possible. For example, in one embodiment, as discussed above, the writes performed by FSM 40 in response to a tamper event can destroy the information (e.g. code or data or both) needed to enter normal operation. This prevents the ability for IC 10 to perform any further operation and thus prevents any dangerous or malicious access to IC 10.

Note that additional circuitry may be present in MRAM circuit 20, as needed, as FIG. 3 only illustrates a simplified version of an MRAM. The circuitry outside of array 42, including the remaining circuitry of MRAM circuit 20 and the circuitry in LDH circuit 26 can collectively be referred to as memory control circuitry. Also, other types of resistive memories may be used in place of the MRAM circuit, and the MRAM circuit or other resistive memories can have other architectures, so long as, during a tamper event, a controller such as FSM 40 changes values stored in at least some of the non-volatile memory cells of the memory array while the controller and memory is powered by the photodiode of an LDH circuit during a tamper event.

Therefore, by now it can be appreciated how a photodiode can be used to detect the breaking through or damaging of a package in which, upon exposure of the photodiode to light, the energy provided by the photodiode itself can be used to modify or clear storage locations of a resistive memory which may store critical data. In this manner, upon any decapsulating or de-lidding of a packaged IC, critical data is automatically destroyed to prevent access by unauthorized users, even when no other power is being provided to or stored by the packaged IC.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, one or more photodiodes may be used to provide energy during a tamper event. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged integrated circuit includes a photodiode, wherein the photodiode generates energy when radiation strikes a surface of the photodiode; a memory including a plurality of non-volatile memory cells and memory control circuitry, wherein the memory control circuitry is configured to perform an operation to change values stored in at least some of the memory cells of the plurality of non-volatile memory cells while being powered by energy generated by the photodiode; and an encapsulant at least partially encapsulating the photodiode and the memory, wherein the encapsulant blocks radiation from reaching the surface of the photodiode. In one aspect of the one embodiment, the packaged integrated circuit further includes a capacitor coupled to store energy generated by the photodiode to raise the voltage across the capacitor for powering the memory control circuitry for changing values stored in at least some of the memory cells of the plurality of non-volatile memory cells. In another aspect, the packaged integrated circuit further includes a voltage regulator for providing the energy generated by the photodiode at a regulated voltage to power the memory for changing values stored in at least some of the memory cells of the plurality of non-volatile memory cells. In another aspect, the plurality of non-volatile memory cells is characterized as resistive memory cells. In a further aspect, the plurality of non-volatile memory cells is characterized as MRAM memory cells. In yet another aspect of the one embodiment, the memory control circuitry includes circuitry for providing addresses of memory locations having memory cells whose values are changeable while being powered by energy generated by the photodiode. In a further aspect, the circuitry includes values to be written to the at least some of the memory cells of the plurality while being powered by energy generated by the photodiode. In another aspect, the plurality of memory cells is located in rows of an array of memory cells, each memory cell of a row is coupled to a word line of a plurality of word lines from a row decoder of the memory control circuitry, wherein the row decoder is powered by energy generated by the photodiode during an operation to change values stored in at least some of the memory cells of the array while the memory control circuit is being powered by energy generated by the photodiode. In another aspect, the packaged integrated circuit further includes an output node for providing a signal to the memory control circuitry indicating that radiation is striking the surface of the photodiode, wherein the memory control circuitry performs an operation to change values stored in at least some of the memory cells of the plurality while being powered by energy generated by the photodiode in response to the signal. In a further aspect, the packaged integrated circuit further includes a capacitor coupled to store energy generated by the photodiode, wherein the signal is generated in response to the voltage of the capacitor rising above a threshold voltage level. In another aspect, the photodiode and memory array are located on an integrated circuit, the integrated circuit including a processor, the integrated circuit including at least one surface that is encapsulated by the encapsulant. In another aspect, a portion of at least some of the memory cells is configured to store security key data. In another aspect, the packaged integrated circuit further includes a power switch configured to power at least portions of the memory from energy from a normal operating power source or from energy generate by the photodiode when radiation is striking the surface to generate energy.

In another embodiment, a method of operating a packaged integrated circuit with a photodiode having a surface and having an encapsulant that blocks radiation from reaching the surface of the photodiode includes after at least a portion of the encapsulant that blocks radiation from reaching the surface of the photodiode is removed, generating energy by the photodiode in response to radiation striking the surface of the photodiode; and changing values stored in at least some memory cells of the memory while the memory is being powered by energy generated by the photodiode. In one aspect of the another embodiment, the values are characterized as security key data. In another aspect, the method further includes after the changing values, performing a power reset; after performing the power reset, reading at least a portion of the values changed in the at least some memory cells, wherein in response to the data read, performing an authentication protocol to determine if operating of the packaged integrated circuit is being performed by an authorized user. In a further aspect, the method further includes preforming authorized debug operations in response to the authentication protocol determining that the operating the packaged integrated circuit is being performed by an authorized user. In another aspect, the method further includes regulating the energy generated by the photodiode to power the memory at a regulated voltage. In yet another aspect, the changing the values include changing the values to a predetermined value that indicates that at least a portion of the encapsulant has been removed.

In yet another embodiment, a packaged integrated circuit includes a photodiode, wherein the photodiode generates energy when radiation strikes a surface of the photodiode; a memory including an array of non-volatile memory cells and memory control circuitry, wherein the memory control circuitry is configured to perform an operation to change values stored in at least some of the memory cells of the array while being powered by energy generated by the photodiode; an encapsulant at least partially encapsulating the photodiode and the memory, wherein the encapsulant blocks radiation from reaching the surface of the photodiode; and a capacitor coupled to the photodiode to store energy generated by the photodiode to raise the voltage of the energy for powering the memory to perform an operation to change values stored in at least some of the memory cells of the array.

What is claimed is:

1. A packaged integrated circuit comprising:
a photodiode, wherein the photodiode generates energy when radiation strikes a surface of the photodiode;
a memory including a plurality of non-volatile memory cells and memory control circuitry, wherein the memory control circuitry is configured to perform an operation to change values stored in at least some of the memory cells of the plurality of non-volatile memory cells while being powered by energy generated by the photodiode;
an encapsulant at least partially encapsulating the photodiode and the memory, wherein the encapsulant blocks radiation from reaching the surface of the photodiode.

2. The packaged integrated circuit of claim 1 further comprising:
a capacitor coupled to store energy generated by the photodiode to raise the voltage across the capacitor for powering the memory control circuitry for changing values stored in at least some of the memory cells of the plurality of non-volatile memory cells.

3. The packaged integrated circuit of claim 1 further comprising:
a voltage regulator for providing the energy generated by the photodiode at a regulated voltage to power the memory for changing values stored in at least some of the memory cells of the plurality of non-volatile memory cells.

4. The packaged integrated circuit of claim 1 wherein the plurality of non-volatile memory cells is characterized as resistive memory cells.

5. The packaged integrated circuit of claim 4 wherein the plurality of non-volatile memory cells is characterized as MRAM memory cells.

6. The packaged integrated circuit of claim 1 wherein the memory control circuitry includes circuitry for providing addresses of memory locations having memory cells whose values are changeable while being powered by energy generated by the photodiode.

7. The packaged integrated circuit of claim 6 wherein the circuitry includes values to be written to the at least some of the memory cells of the plurality while being powered by energy generated by the photodiode.

8. The packaged integrated circuit of claim 1 wherein the plurality of memory cells is located in rows of an array of memory cells, each memory cell of a row is coupled to a word line of a plurality of word lines from a row decoder of the memory control circuitry, wherein the row decoder is powered by energy generated by the photodiode during an operation to change values stored in at least some of the memory cells of the array while the memory control circuit is being powered by energy generated by the photodiode.

9. The packaged integrated circuit of claim 1 further comprising an output node for providing a signal to the memory control circuitry indicating that radiation is striking the surface of the photodiode, wherein the memory control circuitry performs an operation to change values stored in at least some of the memory cells of the plurality while being powered by energy generated by the photodiode in response to the signal.

10. The packaged integrated circuit of claim 9 further comprising:
a capacitor coupled to store energy generated by the photodiode, wherein the signal is generated in response to the voltage of the capacitor rising above a threshold voltage level.

11. The packaged integrated circuit of claim 1 wherein the photodiode and memory array are located on an integrated circuit, the integrated circuit including a processor, the integrated circuit including at least one surface that is encapsulated by the encapsulant.

12. The packaged integrated circuit of claim 1 wherein a portion of at least some of the memory cells is configured to store security key data.

13. The packaged integrated circuit of claim 1 further comprising a power switch configured to power at least portions of the memory from energy from a normal operating power source or from energy generate by the photodiode when radiation is striking the surface to generate energy.

14. A method of operating a packaged integrated circuit with a photodiode having a surface and having an encapsulant that blocks radiation from reaching the surface of the photodiode, the method comprising:
after at least a portion of the encapsulant that blocks radiation from reaching the surface of the photodiode is removed, generating energy by the photodiode in response to radiation striking the surface of the photodiode;
changing values stored in at least some memory cells of the memory while the memory is being powered by energy generated by the photodiode.

15. The method of claim 14 wherein the values are characterized as security key data.

16. The method of claim 14 further comprising:
after the changing values, performing a power reset;
after performing the power reset, reading at least a portion of the values changed in the at least some memory cells, wherein in response to the data read, performing an authentication protocol to determine if operating of the packaged integrated circuit is being performed by an authorized user.

17. The method of claim 16, further comprising:
preforming authorized debug operations in response to the authentication protocol determining that the operating the packaged integrated circuit is being performed by an authorized user.

18. The method of claim 14 further comprising regulating the energy generated by the photodiode to power the memory at a regulated voltage.

19. The method of claim 14 wherein the changing the values include changing the values to a predetermined value that indicates that at least a portion of the encapsulant has been removed.

20. A packaged integrated circuit comprising:
a photodiode, wherein the photodiode generates energy when radiation strikes a surface of the photodiode;
a memory including an array of non-volatile memory cells and memory control circuitry, wherein the memory control circuitry is configured to perform an operation to change values stored in at least some of the memory cells of the array while being powered by energy generated by the photodiode;
an encapsulant at least partially encapsulating the photodiode and the memory, wherein the encapsulant blocks radiation from reaching the surface of the photodiode;
a capacitor coupled to the photodiode to store energy generated by the photodiode to raise the voltage of the energy for powering the memory to perform an operation to change values stored in at least some of the memory cells of the array.

* * * * *